United States Patent
Hu et al.

(10) Patent No.: US 10,510,817 B2
(45) Date of Patent: Dec. 17, 2019

(54) METHOD FOR MANUFACTURING OLED DISPLAY DEVICE, OLED DISPLAY DEVICE AND OLED DISPLAY APPARATUS

(71) Applicant: BOE TECHNOLOGY GROUP CO., LTD., Beijing (CN)

(72) Inventors: Chunjing Hu, Beijing (CN); Changyen Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/993,795

(22) Filed: May 31, 2018

(65) Prior Publication Data
US 2019/0181197 A1    Jun. 13, 2019

(30) Foreign Application Priority Data
Dec. 8, 2017    (CN) .......................... 2017 1 1294843

(51) Int. Cl.
| | |
|---|---|
| *H01L 27/32* | (2006.01) |
| *H01L 51/50* | (2006.01) |
| *H01L 51/00* | (2006.01) |
| *H01L 51/56* | (2006.01) |

(52) U.S. Cl.
CPC ...... *H01L 27/3246* (2013.01); *H01L 51/0005* (2013.01); *H01L 51/5072* (2013.01); *H01L 51/5092* (2013.01); *H01L 51/56* (2013.01)

(58) Field of Classification Search
CPC ............ H01L 27/3246; H01L 51/5092; H01L 51/5072; H01L 51/0005; H01L 51/56
See application file for complete search history.

(56) References Cited

U.S. PATENT DOCUMENTS

| | | | | | |
|---|---|---|---|---|---|
| 2013/0015491 | A1* | 1/2013 | Kim | ................... | H01L 51/5092 257/99 |
| 2013/0292666 | A1* | 11/2013 | Sonoda | ................. | C23C 14/042 257/40 |
| 2016/0056218 | A1* | 2/2016 | Wang | .................. | H01L 27/3246 257/40 |
| 2016/0293683 | A1* | 10/2016 | Hou | .................... | H01L 27/3246 |
| 2016/0365396 | A1* | 12/2016 | Jiao | ...................... | H01L 27/3246 |
| 2018/0166648 | A1* | 6/2018 | Dai | ......................... | H01L 51/56 |
| 2018/0212181 | A1* | 7/2018 | Wang | ................... | H01L 27/3246 |
| 2018/0294412 | A1* | 10/2018 | Cui | ...................... | H01L 51/0005 |
| 2019/0035865 | A1* | 1/2019 | Cui | ...................... | H01L 27/3246 |
| 2019/0096970 | A1* | 3/2019 | Hou | ..................... | H01L 27/3246 |
| 2019/0172876 | A1* | 6/2019 | Xia | ...................... | H01L 27/3209 |
| 2019/0229298 | A1* | 7/2019 | Shi | ......................... | H01L 51/56 |

* cited by examiner

*Primary Examiner* — Joseph C. Nicely
(74) *Attorney, Agent, or Firm* — Calfee, Halter & Griswold LLP

(57) ABSTRACT

The present disclosure discloses a method for manufacturing an OLED display device, including: forming a pixel-defining layer on a substrate to define a plurality of pixel regions, forming an organic film layer in each pixel region, determining at least one area to be compensated in the pixel region according to a surface shape of the organic film layer; aligning an evaporation source, an opening of a mask and the pixel region, making each opening of the mask respectively correspond to the position of each area to be compensated; forming an electron function layer in the area to be compensated by means of evaporation of the evaporation source, wherein the electron function layer is configured to compensate a surface shape of the organic film layer in the pixel region.

13 Claims, 4 Drawing Sheets

METHOD FOR MANUFACTURING OLED DISPLAY DEVICE, OLED DISPLAY DEVICE AND OLED DISPLAY APPARATUS

CROSS REFERENCE TO RELATED APPLICATIONS

This application claims the priority of the Chinese Patent Application No. 201711294843.7, filed on Dec. 8, 2017, which is incorporated herein by reference in its entirety.

TECHNICAL FIELD

The present disclosure relates to a method of manufacturing an OLED display device, an OLED display device and an OLED display apparatus.

BACKGROUND

Compared with LCD, OLED (organic light-emitting device) has the advantages of self-luminescence, quick reaction, wide viewing angle, high brightness, vividness of color, light and thin appearance, and the like, and is thus considered to be the next generation of display technology.

The OLED thin film deposition method mainly includes vacuum vapor deposition and solution-based process. The vacuum vapor deposition is suitable for organic small molecule, which has the advantage of uniformity of film and is a relatively mature technology, but the equipment investment is big, the material utilization rate is low, and the alignment accuracy of a mask of the product in a large size is low. The solution-based process, comprising rotary coating method, inkjet printing method, nozzle coating method and the like, is suitable for polymer materials and soluble small molecules, and is characterized in low equipment costs, mass production and product in a large size.

Among them, inkjet printing technology can effectively and precisely spray ink to a pixel region, thereby forming an organic film layer. But, the most difficult problem thereof is that it is difficult for an organic solution to form an organic film layer with uniform thickness in a pixel region.

SUMMARY

According to one aspect of the present disclosure, a method for manufacturing an OLED display device is provided, which includes: forming a pixel-defining layer on a substrate to define a plurality of pixel regions, forming an organic film layer in each pixel region, determining at least one area to be compensated in the pixel region according to a surface shape of the organic film layer; aligning an evaporation source, an opening of a mask and the pixel region, making each opening of the mask respectively correspond to the position of each area to be compensated; forming an electron function layer in the area to be compensated by means of evaporation of the evaporation source, wherein the electron function layer is configured to compensate a surface shape of the organic film layer in the pixel region.

According to an embodiment, further including: determining a size of the opening and a distance between the mask and the evaporation source, according to a distance between the evaporation source and the pixel-defining layer and a size of the area to be compensated.

According to an embodiment, the size of the opening of the mask is less than the size of the area to be compensated, the method further including: adjusting a position of the mask in such a way that a rate of a first ratio to a second ratio is equal to or close to 1, wherein the first ratio is a ratio of the distance between the evaporation source and the mask to the size of the opening, and the second ratio is a ratio of the distance between the evaporation source and the pixel-defining layer to the size of the area to be compensated.

According to an embodiment, the surface shape of the organic film layer is determined according to material of the pixel-defining layer.

According to an embodiment, the pixel-defining layer is formed of a hydrophilic material; and the area to be compensated which corresponds to the entire pixel region is determined on the surface of the organic film layer in each pixel region.

According to an embodiment, a thickness of a periphery of the organic film layer is greater than a thickness of a center of the organic film layer in each pixel region, and the number of the areas to be compensated in each pixel region is 1.

According to an embodiment, the pixel-defining layer is formed of a hydrophobic material; and at least two the areas to be compensated, which jointly correspond to the entire pixel region, are determined on the surface of the organic film layer in each pixel region.

According to an embodiment, a thickness of a periphery of the organic film layer is less than a thickness of a center of the organic film layer in each pixel region, and the number of the areas to be compensated in each pixel region is 2 or 4.

According to an embodiment, the electron function layer is an electron injection layer or an electron transport layer.

According to an embodiment, the electron transport layer is doped with metal lithium.

According to an embodiment, the organic film layer is formed in each pixel region by inkjet printing.

According to another aspect of the present disclosure, an OLED display device, which is manufactured by any one of the above-mentioned methods for manufacturing an OLED display device, is further provided.

According to another aspect of the present disclosure, an OLED display apparatus is further provided, which includes an OLED display device that is manufactured by any one of the above-mentioned methods for manufacturing an OLED display device.

DETAILED DESCRIPTION

The embodiments of the present disclosure are described in detail below with reference to the drawings.

Figure 1:
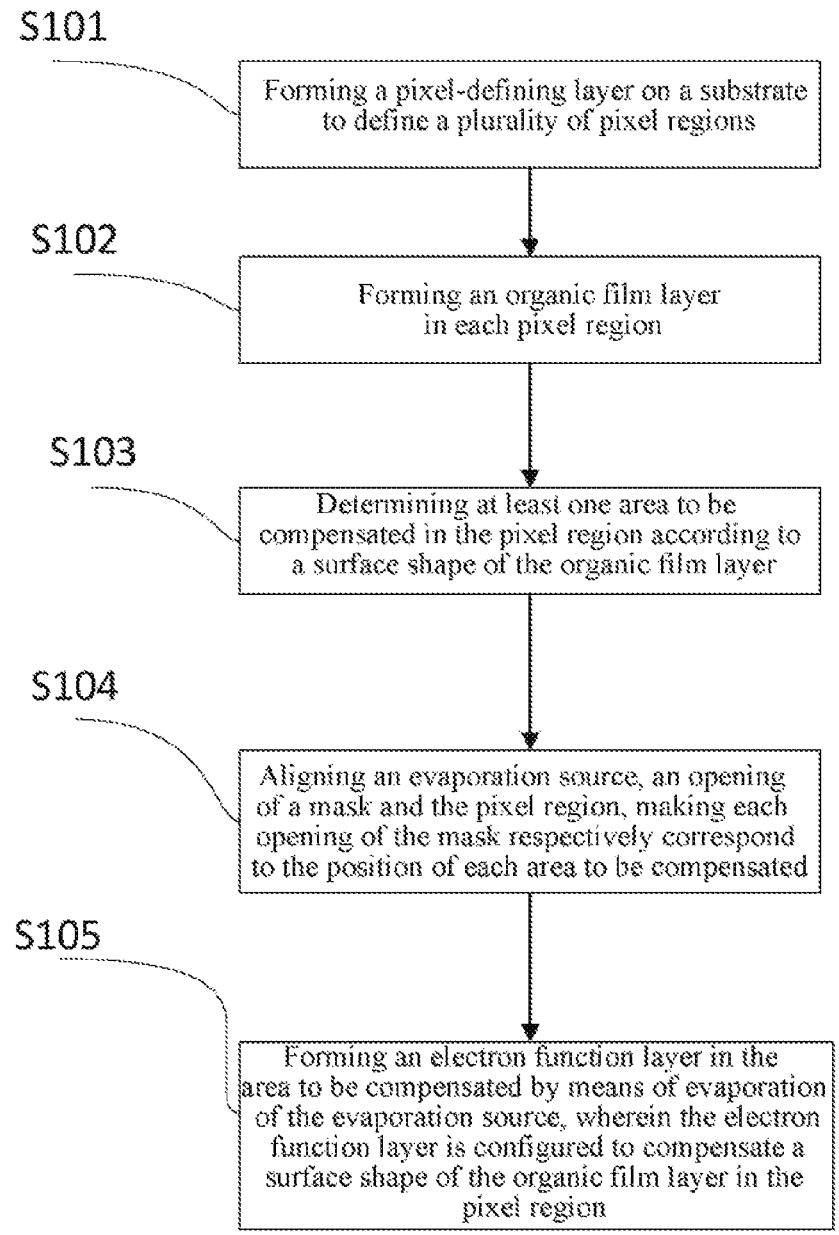
FIG. 1 is a schematic flowchart of a method for manufacturing an OLED display device according to an embodiment of the present disclosure.

FIG. 1 is a schematic flowchart of a method for manufacturing an OLED display device according to an embodiment of the present disclosure. FIGS. 2A-2D are side views of the structure of the device according to the implementation processes of the embodiment shown in FIG. 1.

As shown in FIGS. 1 and 2A-2D, the method for manufacturing an OLED display device of the embodiment of the present disclosure includes the following.

S101: forming a pixel-defining layer on a substrate to define a plurality of pixel regions.

Figure 2A:
FIGS. 2A-2D are side views of the structure of the device according to the implementation processes of the embodiment shown in FIG. 1.

In the embodiment of the present disclosure, a grid-like pixel-defining layer 20 is formed on a substrate 10 such as a glass substrate or a TFT substrate by way of e.g. photoresist or inkjet printing. FIG. 2A shows a side view of one of the grids. Each grid as shown in FIG. 2A is a pixel region (also known as a pixel bank) defined by the pixel-defining layer 20. An ITO electrode corresponding to each pixel region can be pre-formed on the substrate 10 as an anode for each pixel region.

S102: forming an organic film layer in each pixel region by inkjet printing.

Figure 2B:
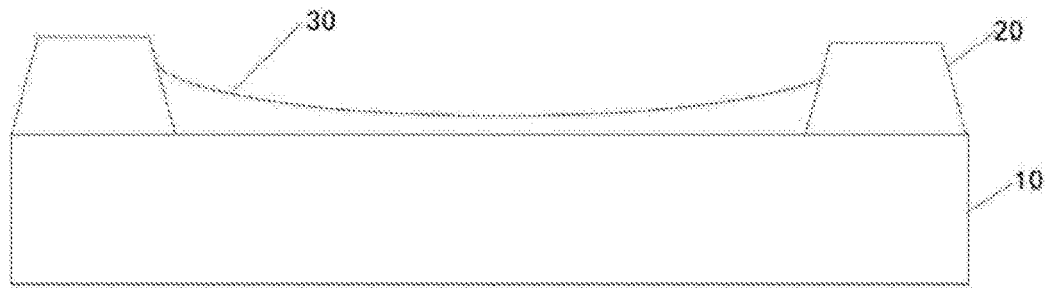

As shown in FIG. 2B, an organic film layer 30, for example, HIL (hole injection layer), HTL (hole transport layer), and EML (emitting material layer) and the lie may be formed in each pixel region by inkjet printing. In some embodiments of the present disclosure, a part of or all of the organic film layers 30 can be formed by inkjet printing. After the printing is finished, the surface layer of the organic film layer 30 in the pixel region is e.g. EML.

S103: determining at least one area to be compensated in the pixel region according to the surface shape of the organic film layer.

Depending on that the pixel-defining layer is a hydrophilic material or a hydrophobic material, the organic film layers, which are formed by inkjet printing in the pixel region, have different surface shapes. In the pixel region defined by a hydrophilic pixel-defining layer, an organic film layer with a thick periphery and a thin center is readily formed, while in the pixel region defined by a hydrophobic pixel-defining layer, an organic film layer with a thick center and a thin periphery is readily formed. In the embodiment of the present disclosure, in order to compensate for the surface shape of the organic film layer, according to the characteristic of the surface shape of the organic film layer, one or more areas to be compensated are determined in the pixel region, and according to the determined position of the area to be compensated, an opening 41 corresponding to each of the areas to be compensated is formed at a mask 40 for evaporation (FIG. 2C).

S104: aligning an evaporation source, the opening of the mask and the pixel region, and the opening of the mask respectively correspond to the position of the area to be compensated.

Figure 2C:
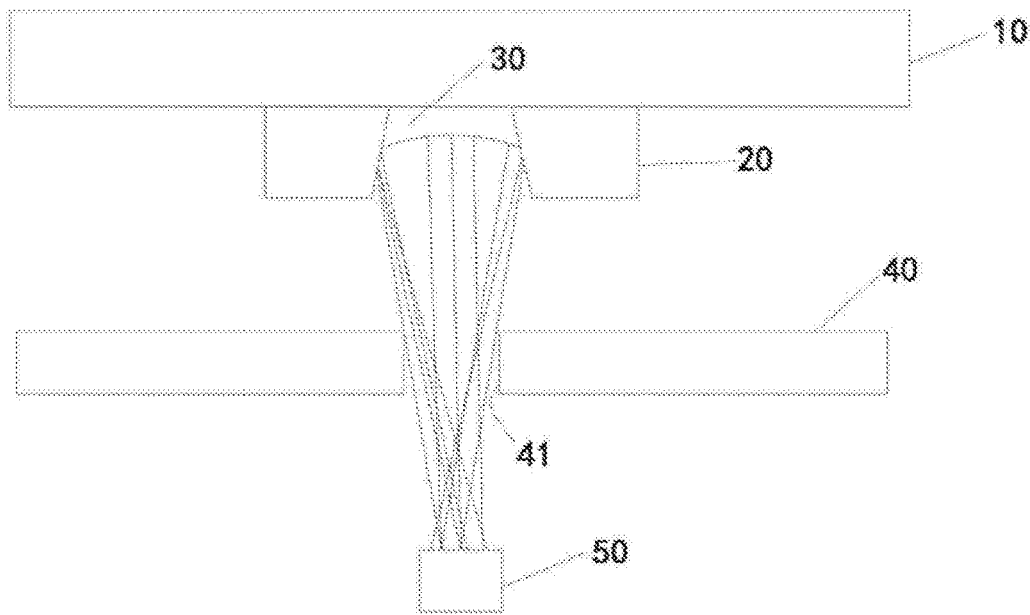

As shown in FIG. 2C, the mask 40, in which the opening 41 is formed in the Step S103, is arranged below the pixel region, such that the opening 41 formed at the mask 40 and the area to be compensated in the pixel region are respectively aligned. The evaporation source 50 is arranged below the mask 40 and to be aligned with the opening 41, such that the evaporation port of the evaporation source 50, the opening 41 of the masking plate 40, and the area to be compensated in the pixel region that is defined by the pixel-defining layer 20 are aligned.

S105: while forming an electron function layer in the area to be compensated by means of evaporation of the evaporation source, compensating for the surface shape of the organic film layer in the pixel region.

Figure 2D:
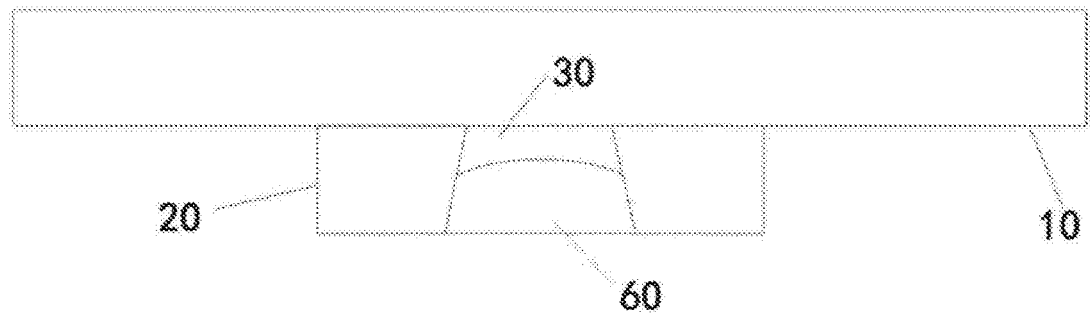

After the evaporation and compensation, the pixel region as shown in FIG. 2D is formed, wherein the electron function layer 60, which is formed on the surface of the organic film layer 30 in the pixel region by the evaporation source 50, compensates for the surface shape of the organic film layer 30. The electron function layer 60 and the organic film layer 30 are compensated for each other in shape, such that the pixel region has a flat surface. Moreover, in addition to compensate for the shape, the electron function layer 60 itself is a constituent part of the pixel region, such that the surface shape of the organic film layer 30 in the pixel region is compensated while the electron function layer 60 is formed.

By way of the method for manufacturing an OLED display device of the embodiment of the present disclosure, the compensation for the surface shape of the organic film layer that is formed by inkjet printing in pixel region is realized while the electron function layer is normally formed in the pixel region by evaporation process. Therefore, the uniformity of the entire function layer in the pixel region is effectively improved, and the optical property of the OLED display device is also improved, thereby enhancing the display effect of the display apparatus.

Figure 3:
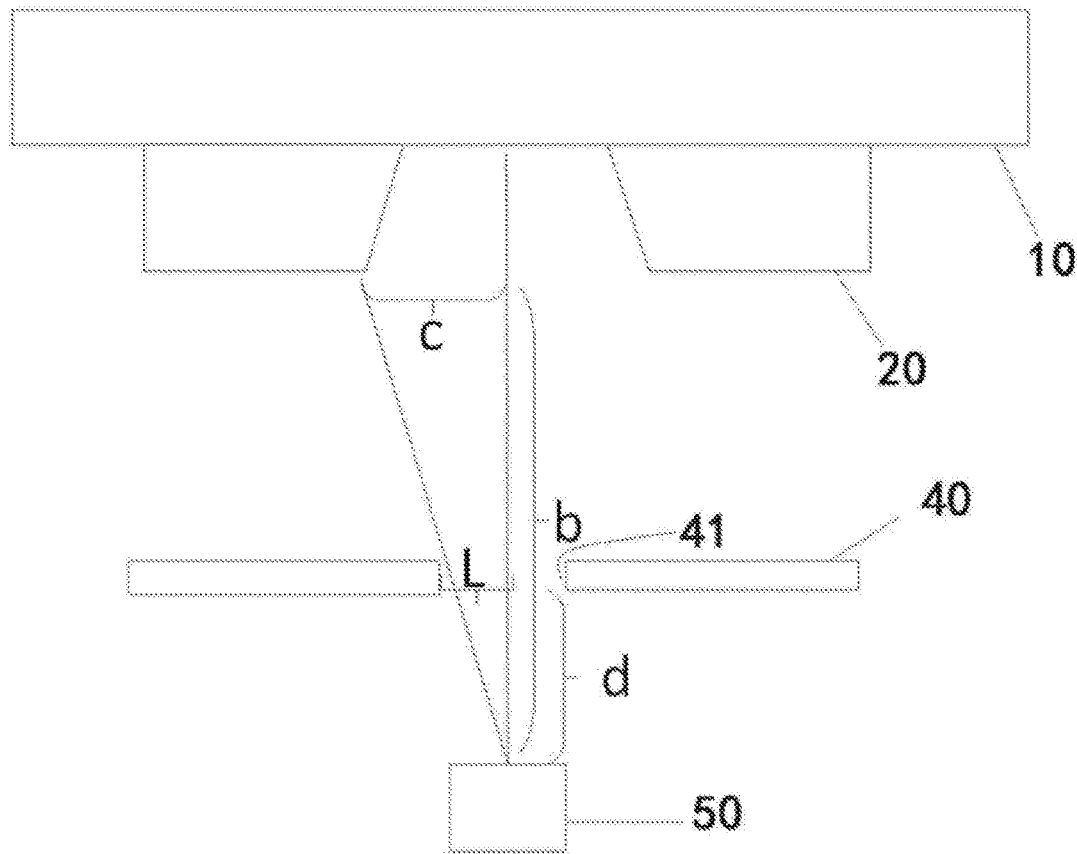
FIG. 3 is a schematic scaled view of a method for manufacturing an OLED display device according to another embodiment of the present disclosure.

FIG. 3 is a schematic scaled view of a method for manufacturing an OLED display device according to another embodiment of the present disclosure.

Some embodiments of the present disclosure are described below with reference to FIG. 3.

In the embodiment of the present disclosure, the distance between the evaporation source 50 and the substrate 10 is fixed, and 80 ppi is taken as an example. For 80 ppi, the pixel size is 158 μm×52 μm. The size of the pixel region as shown in the side view of FIG. 3 is configured in a way that the longer side of the pixel region is 158 μm. At present, in the pixel region formed by ink-jet printing, the thickness difference between the periphery and the center of the organic film layer is 20 nm. After the organic film layer in the pixel region is subjected to evaporation to form a evaporation and compensation layer (i.e. the electron functional layer formed by evaporation) by means of the method in the embodiment of the present disclosure so as to compensate the surface shape of the organic film layer, the thickness of the thinnest part of the organic film layer (i.e. the thickest part of the evaporation and compensation layer) in the pixel region is increased by at least 10 nm, such that the value of thickness difference between the center and the periphery of the pixel region after the compensation is less than or equal to 10 nm. and the surface area of the evaporation and compensation layer formed on the organic film layer in a single pixel region is at least 80% of the total area of the pixel region, which is in an acceptable range for the performance of the display device. For this purpose, in the embodiment of the present disclosure, as shown in FIG. 3, when the half width L of the opening 41 on the mask 40, the distance d between the mask 40 and the evaporation source 50, the distance b between the evaporation source 50 and the pixel-defining layer 20, and the half width c of the area to be compensated (in FIG. 3, there is one area to be compensated in the pixel region) satisfy the following condition, i.e. the rate of the first ratio d/L to the second ratio b/c is equal to or close to 1, the evaporation and compensation for the organic film layer in the pixel region can be better realized. For example, the rate is 0.9 or 1.1.

For example, the manufacturing method of an embodiment of the present disclosure can further include the following step: determining the position of the opening on the mask 40, which corresponds to the position of each of the areas to be compensated, and determining the size of the opening 41 (the half width L or the width 2L) and the distance d between the mask and the evaporation source, according to the distance b between the evaporation source 50 and the pixel-defining layer 20 and the size of the area to be compensated (the half length c or the length 2c). In particular, in the embodiment of the present disclosure, the distance b between the evaporation source 50 and the pixel-defining layer 20 is fixed, while the size c of the area to be compensated that is determined according to the surface shape of the organic film layer in the pixel region is also known. In this case, according to the constraint condition that the rate of the first ratio d/L to the second ratio b/c is equal to or close to 1, the size L of the opening 41 and the distance d between the mask 40 and the evaporation source 50 that is at the above-mentioned fixed ratio to L may be pre-determined, such that the opening is formed in the predetermined size L when the mask is manufactured, and according to the distance d between the mask 40 and the evaporation source 50, which is determined at the same time, the mask 40 is arranged at the distance d above the evaporation source 50 when the mask 40 is arranged. Therefore, the evaporation and compensation of the embodiment of the present disclosure is realized.

For example, in another embodiment of the present disclosure, during S103 of manufacturing the mask with opening respectively corresponding to each of the areas to be compensated, without firstly determining the size of the opening 41 by the above-mentioned condition, the opening may be formed respectively correspond to each area to be compensated, on the mask 40. The opening 41 is formed in such a way that the size L is less than the size c of the areas to be compensated and greater than the minimum threshold value. And, when the mask 40 is arranged below the substrate 10, according to the above constraint condition that the rate of the first ratio d/L to the second ratio b/c is equal to or close to 1, the position of the mask 40 is adjusted in such a way that the rate of the first ratio to the second ratio is equal to or close to 1, wherein the first ratio is the distance between the evaporation source 50 and the mask 40 to the size L of the opening 41, and the second ratio is the distance between the evaporation source 5 and the pixel-defining layer to the size of the area to be compensated. That is to say, the mask 40 is arranged at a distance of approximately bL/c above the evaporation source 50. Therefore, the evaporation and compensation of the embodiment of the present disclosure is realized.

In the embodiment of the present disclosure, by controlling the size of the opening of the mask and the distance between the mask and the evaporation source or the substrate, and by forming an electron function layer by means of evaporation for compensating the thickness of the organic film layer player that is printed in the pixel region, the uniformity of the overall thickness of the film can be ensured, thus ensuring the optical property of the display device.

In the embodiment of the present disclosure, the number and position of the areas to be compensated in the pixel region is determined according to the surface shape of the organic film layer 30 in the pixel region.

The surface shape of the organic film layer 30 can be determined according to the surface shape observed after the organic film layer 30 formed by inkjet printing, or according to the material of the pixel-defining layer.

Referring to FIGS. 2B-2D, in an embodiment of the present disclosure, the pixel-defining layer 20 is made of hydrophilic material, and the organic film layer 30, which is formed in the pixel region defined by the pixel-defining layer 20, has a thick periphery and a thin center, as shown in 2B. In this case, in the embodiment of the present disclosure, one area to be compensated corresponding to the entire pixel region is determined on the surface of the organic film layer 30 in each pixel region. As shown in FIG. 2C, each opening 41 on the mask 40 corresponds to one area to be compensated (corresponding to the entire pixel region), and while the electron function layer is vapor deposited for one area to be compensated by each evaporation source 50, the surface shape of the organic film layer 30 in the area to be compensated is compensated. The evaporation path of the evaporation source 50 is fan-shaped. From this, the evaporation thickness of the center of the area to be compensated is greater than the evaporation thickness of the periphery of the area to be compensated, such that the shape of the electron function layer 60 by evaporation and the surface shape of the organic film layer 30 in the area to be compensated are complementary. Referring to FIG. 2D, the surface of the electron function layer that is finally-formed in the pixel region is rather flat. In the embodiment of the present disclosure, the overall thickness of the film in the pixel region can be uniform in the case where the pixel-defining layer is made of hydrophilic material, such that the optical property of the pixel region is ensured, thus improving the display effect of the OLED display device.

Figure 4A:
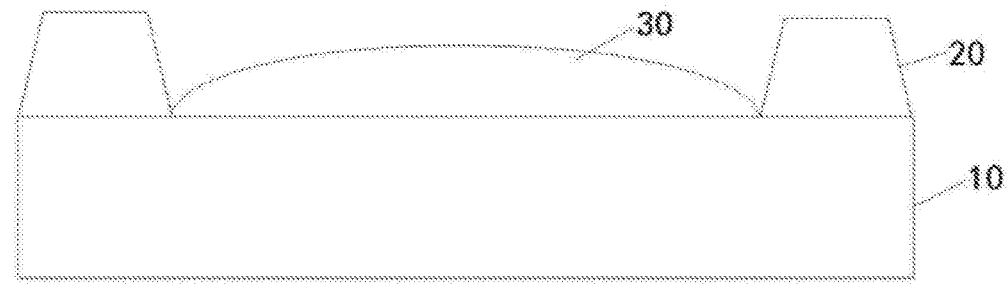
FIGS. 4A-4C are schematic side views of the structure of the device formed by a method for manufacturing an OLED display device according to another embodiment of the present disclosure.
Figure 4B:
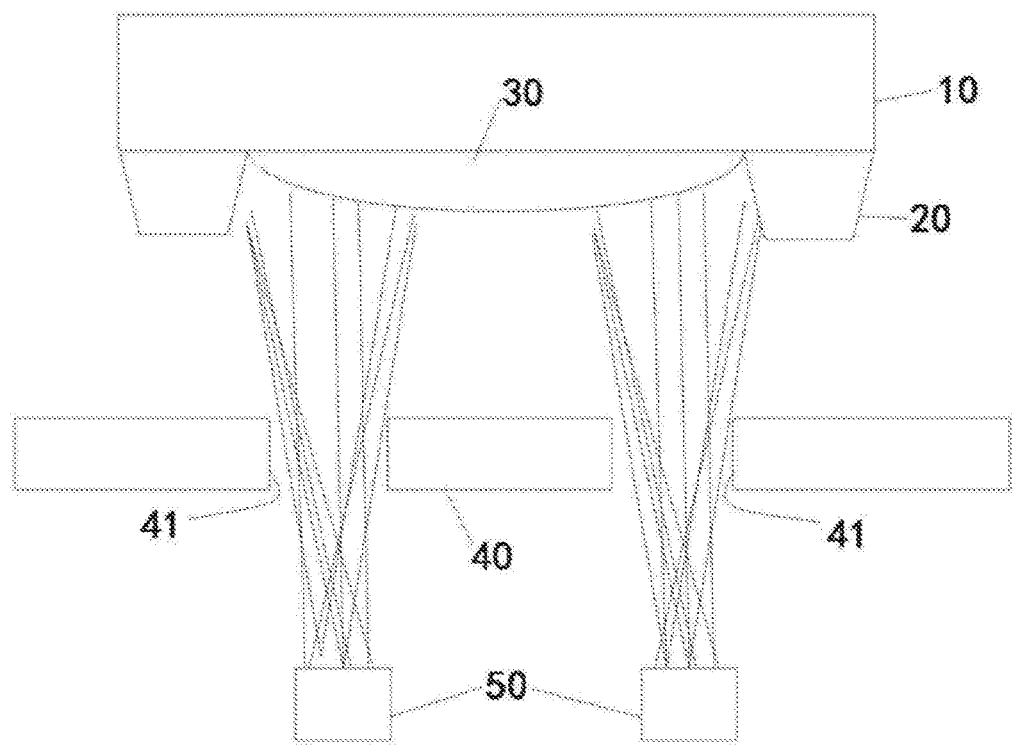
Figure 4C:
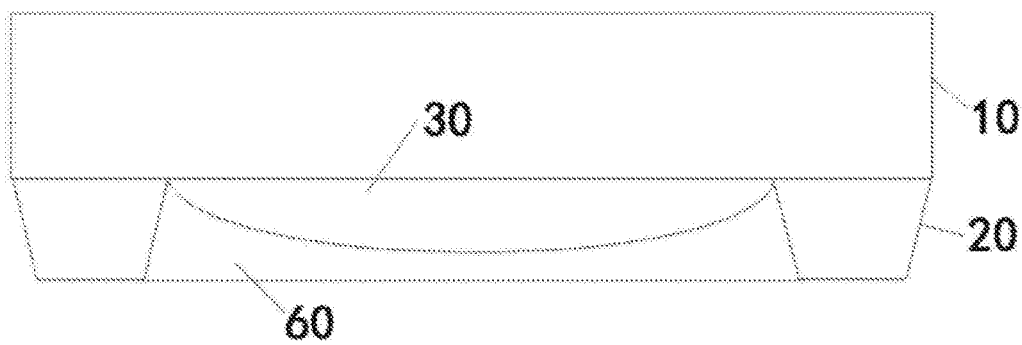

FIGS. 4A-4C are schematic side views of the structure of the device formed by a method for manufacturing an OLED display device according to another embodiment of the present disclosure.

Referring to FIGS. 4A-4C, in the embodiment of the present disclosure, the pixel-defining layer is made of hydrophobic material, and the organic film layer 30, which is formed in the pixel region defined by the pixel-defining layer 20, has a thin periphery and a thick center, as shown in 4A. In this case, in the embodiment of the present disclosure, at least two areas to be compensated jointly corresponding to the entire pixel region are determined on the surface of the organic film layer 30 in each pixel region, for example, the number of areas to be compensated is two, four or more, which may be determined specifically according to the overall size of the pixel region and the number of the evaporation sources. FIG. 4B schematically shows the case that two areas to be compensated are vapor deposited in one pixel region. It should be noted that, FIG. 4B is merely exemplary in nature and does not indicate the actual position relationship of the arrangement. In practical application, the areas to be compensated in one pixel region may be spaced apart, adjoined to one another, or overlapped at the periphery. As shown in FIG. 4B, each opening 41 on the mask 40 corresponds to one area to be compensated, and while the electron function layer is vapor deposited for one of the two areas to be compensated in the pixel region by each evaporation source 50, the surface shape of the organic film layer 30 in the area to be compensated is compensated. The evaporation path of the evaporation source 50 is fan-shaped. In this case, the evaporation thickness of the center of the area to be compensated is greater than the evaporation thickness of the periphery of the area to be compensated, such that the thickness of evaporation portion corresponding to peripheral portion with relatively thin thickness at each segment of the organic film layer 30 is relatively large, such that the shape of the electron function layer 60, which is vapor deposited at the organic film layer 30 in the same pixel region by cooperative means of two evaporation sources 50, and the surface shape of the entire organic film layer 30 in the pixel region are complementary or as complementary as possible. Referring to FIG. 4C, the surface of the electron function layer that is finally-formed in the pixel region is rather flat. In the embodiment of the present disclosure, the overall thickness of the film in the pixel region can be relatively uniform in the case where the pixel-defining layer is made of hydrophobic material, such that the optical property of the pixel region is ensured, thus improving the display effect of the OLED display device.

In some embodiments of the present disclosure, the electron function layer 60 may be an electron injection layer. For example, after an EML is formed by printing in the pixel region, an electron transport layer is first vapor deposited on the surface of the EML by using common evaporation method, and then, the electron injection layer is vapor deposited on the surface of the electron transport layer by using the method of the embodiment of the present disclosure, at the same time, the surface shape of the electron transport layer is compensated. Then, a cathode may be vapor deposited on the surface of the electron injection layer by using common evaporation method, to finish the manufacture of the display device.

In some embodiments of the present disclosure, the electron function layer 60 may be an electron transport layer. For example, after an EML is formed by printing in the pixel region, the electron transport layer is vapor deposited on the surface of the EML by directly using the method of the embodiment of the present disclosure, at the same time, the surface shape of the EML is compensated. Then, an electron injection layer and a cathode may be vapor deposited on the surface of the electron transport layer by using common evaporation method, to finish the manufacture of the display device. In the embodiment of the present disclosure, in order to ensure the electrical property, the electron transport layer may be doped with metal, such as the metal lithium.

The embodiment of the present disclosure further provides an OLED display device, which is manufactured by the method for manufacturing the OLED display device according to any one of the embodiments of the present disclosure. The resulting OLED display device can effectively improve the uniformity of the thickness of the film formed in the pixel region, enhance the optical property of the OLED display device, without any affecting electrical property of the pixel region, and can thus improve the display effect of the OLED display device.

The embodiment of the present disclosure further provides an OLED display apparatus, including the OLED display device manufactured by the method for manufacturing the OLED display device according to any one of the embodiments of the present disclosure. By including the OLED display device with improved optical property that is formed as described above, the display effect of the OLED display apparatus can be effectively enhanced.

By means of the solutions of the embodiments of the present disclosure, the uniformity of the formed film in the pixel region can be effectively improved, the optical property of the OLED display device can be enhanced, and the display effect of the OLED display apparatus is thus improved.

Although some embodiments of the present disclosure have been described, the present disclosure is not limited to the above specific embodiments. Various modifications and variations can be made to the above-mentioned embodiments by those skilled in the art without departing from the conception of the present disclosure. These variations and modifications of the embodiments fall within the protection scope of the present invention.

What is claimed is:

1. A method for manufacturing an OLED display device, comprising:

forming a pixel-defining layer on a substrate to define a plurality of pixel regions, forming an organic film layer in each pixel region, determining at least one area to be compensated in the pixel region according to a surface shape of the organic film layer;

aligning an evaporation source, an opening of a mask and the pixel region, making each opening of the mask respectively correspond to the position of each area to be compensated;

forming an electron function layer in the area to be compensated by evaporation of the evaporation source, wherein the electron function layer is configured to compensate a surface shape of the organic film layer in the pixel region.

2. The method according to claim 1, further comprising:
determining a size of the opening and a distance between the mask and the evaporation source, according to a distance between the evaporation source and the pixel-defining layer and a size of the area to be compensated.

3. The method according to claim 1, wherein the size of the opening of the mask is less than the size of the area to be compensated, the method further comprising:
adjusting a position of the mask in such a way that a rate of a first ratio to a second ratio is equal to or close to 1, wherein the first ratio is a ratio of the distance between the evaporation source and the mask to the size of the opening, and the second ratio is a ratio of the distance between the evaporation source and the pixel-defining layer to the size of the area to be compensated.

4. The method according to claim 1, wherein the surface shape of the organic film layer is determined according to material of the pixel-defining layer.

5. The method according to claim 4, wherein
the pixel-defining layer is formed of a hydrophilic material; and
the area to be compensated which corresponds to the entire pixel region is determined on the surface of the organic film layer in each pixel region.

6. The method according to claim 5, wherein
a thickness of a periphery of the organic film layer is greater than a thickness of a center of the organic film layer in each pixel region, and the number of the areas to be compensated in each pixel region is 1.

7. The method according to claim 4, wherein
the pixel-defining layer is formed of a hydrophobic material; and
at least two the areas to be compensated, which jointly correspond to the entire pixel region, are determined on the surface of the organic film layer in each pixel region.

8. The method according to claim 7, wherein
a thickness of a periphery of the organic film layer is less than a thickness of a center of the organic film layer in each pixel region, and the number of the areas to be compensated in each pixel region is 2 or 4.

9. The method according to claim 1, wherein the electron function layer is an electron injection layer or an electron transport layer.

10. The method according to claim 9, wherein the electron transport layer is doped with metal lithium.

11. The method according to claim 1, wherein the organic film layer is formed in each pixel region by inkjet printing.

12. An OLED display device, wherein an OLED display device is formed by using the method for manufacturing an OLED display device as in claim 1.

13. An OLED display apparatus, wherein the OLED display apparatus comprises an OLED display device that is formed by using the method for manufacturing an OLED display device as in claim 1.

* * * * *